United States Patent [19]

Streit

[11] 4,429,234
[45] Jan. 31, 1984

[54] THRESHOLD SWITCH

[75] Inventor: Klaus Streit, Tübingen, Fed. Rep. of Germany

[73] Assignee: Robert Bosch GmbH, Stuttgart, Fed. Rep. of Germany

[21] Appl. No.: 316,755

[22] Filed: Oct. 30, 1981

[30] Foreign Application Priority Data

Dec. 2, 1980 [DE] Fed. Rep. of Germany ....... 3045366

[51] Int. Cl.$^3$ ........................................... H03K 5/153
[52] U.S. Cl. .................................. 307/350; 307/354; 307/360; 307/244; 307/299 B
[58] Field of Search ................ 307/354, 355, 356, 360, 307/362, 299 B, 350, 244; 330/257; 328/150

[56] References Cited

U.S. PATENT DOCUMENTS

| 3,673,508 | 6/1972 | Callahan, Jr. | 307/299 B |
| 3,700,921 | 10/1972 | Gay | 307/360 |
| 3,825,852 | 7/1974 | Pinckaers | 330/257 |
| 3,848,139 | 11/1974 | Holt, Jr. | 307/355 |
| 4,271,364 | 6/1981 | Leonard | 307/355 |

Primary Examiner—John Zazworsky
Attorney, Agent, or Firm—Frishauf, Holtz, Goodman & Woodward

[57] ABSTRACT

To permit evaluation of only slowly changing low amplitude undulating signals, derived for example from a wheel-speed transducer of a brake anti-block system, and to obtain essentially square-wave output voltage signals having a 1:1 pulse to pulse gap ratio for further signal processing, a temperature stable threshold switch is provided by connecting transistors forming a difference amplifier and purposely mismatched to the input, the mismatch of the transistors defining the threshold level, and being obtained by mismatch in the output circuit thereof, preferably and for example by using pnp lateral transistors having multiple collectors in which the ratio of length of the partial collectors is other than 1:1, and connected, preferably, to a current mirror which has its output connected to the partial collector of the other of the pnp lateral transistors. The circuit can be further expanded by connection of the output to a flipflop to provide a true square-wave output, and may be made independent of input connection by providing input transistor circuitry, preferably in form of an emitter-follower. Rather than forming partial collectors of the lateral transistors of unequal ratio, the transistors forming the current mirror may be constructed to have different emitter surfaces; or both partial unequal collectors, or equivalents, and current mirror emitters or equivalents, can be used.

18 Claims, 11 Drawing Figures

THRESHOLD SWITCH

The present invention relates to a threshold switch and more particularly to a threshold switch which can be used in combination with inductive transducers which provide output signals of essentially sine-wave shape of low amplitude, for example as provided by vehicle brake anti-block system transducers.

BACKGROUND

Vehicle anti-block systems frequently utilize inductive transducers which, at low vehicle speed and due to the comparatively large air-gap in the magnetic system provide sine-like output signal of low amplitude. The output voltage derived from such transducers is analyzed in circuits, including threshold switches. This output voltage, for example, should be converted into square-wave signals of 1:1 duty cycle, that is, approximately equal space between pulses and gaps for subsequent signal processing in a logic circuit. The signal processing apparatus usually uses bipolar planar integrated circuits. The signal-to-noise ratio to the input of the logic circuits should be as high as possible. Accordingly, there is a demand for threshold switches which may include threshold switch circuits which are essentially temperature-stable, accurate with respect to reference voltage levels, for example a ground or chassis voltage level, and which is symmetrical with respect to response voltages, while, additionally, including some hysteresis.

Threshold switches which can be used in vehicle anti-block circuits frequently utilize comparators with integrated circuit (IC) operational amplifiers which have a positive feedback circuit including at least a resistor which leads from the output of the circuit to the direct input thereof in order to provide for hysteresis. Various circuits are known to generate a fixed reference voltage, for example bandgap voltage circuits.

THE INVENTION

It is an object to provide an improved threshold switch, in the form of a threshold switch circuit which meets rigorous requirements and can carry out the functions desired for use in a vehicle brake antiblock system, for example.

Briefly, a differential circuit is provided including two transistors which are mismatched by a predetermined extent; the mismatch is provided by circuitry coupled to the output circuit system of the differential amplifier.

In a preferred form, two lateral pnp transistors are used, having their emitters galvanically coupled and connected over a current source to a positive operating line. The collectors of the two pnp lateral transistors are subdivided into two parallel collectors, each, in which, respectively, the second partial collector of the two lateral transistors is connected with the input of a npn current mirror circuit, including further transistors, the output being respectively connected with a first partial collector of the other of the two lateral transistors and with the base of an output transistor. Temperature compensation threshold voltages can be obtained by including resistors in the emitter lines to the two pnp lateral transistors and making the supply current of the differential amplifier proportional to a diode voltage.

The circuit has the advantage that the outputs of the differential amplifier, by a predetermined mismatch of the input transistors, due to uneven emitter currents in the differential amplifier transistor, for example, can be readily controlled. The input difference voltage, required to switch the outputs, can be supplied with a current responsive to a temperature variation. Resistors can be provided in series to the emitters of the input transistors which have current flowing therethrough which are proportional through a diode voltage, for example the base-emitter voltage of a transistor. The switch-over points can be defined by suitable dimensioning of these resistors. The voltage and current relationships are so arranged, as in bandgap reference sources, that the input response voltage is, essentially, temperature independent.

The input or connection reference voltages can be made symmetrically or asymmetrically with respect to a reference voltage. The input threshold voltages, which determine the switch-over, with respect to a reference, can be as large or as small as desired, as long as it is not equal to the bandgap voltage itself. The input threshold level of the voltage can be arranged by defined deviation from a division of the voltage proportional to the bandgap voltage of the components, arranged as a temperature coefficient which can differ from zero.

In accordance with a feature of the invention hysteresis between input threshold levels is obtained by connecting a flipflop (FF) circuit in an output network. This has the advantage with respect to comparators or threshold circuits of the prior art that hysteresis is obtained without interfering with input threshold levels which can affect the accuracy of the response, and particularly the temperature stability thereof. Dynamic problems, which occur upon coupling between input and output, due to the high loop amplification and delays which occur over various amplification stages are effectively avoided.

The circuit, particularly when using two lateral pnp transistors has the additional advantage that the output circuit can be effectively matched to further circuitry; for example, it can be arranged to have single outputs, or formed as a window-comparator. Further logical interconnecting between available outputs are possible in accordance with the requirements of circuitry coupled to the threshold circuit of this invention.

DRAWINGS

Figure 11:
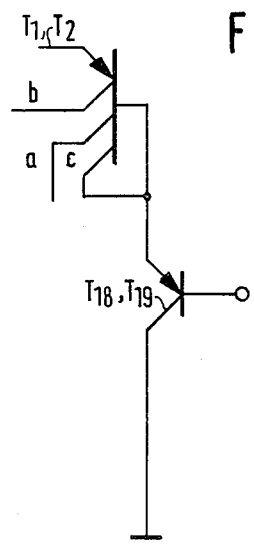

and FIG. 11 illustrates a further embodiment in which the base of each of the two pnp lateral transistors, which form the differential amplifier, have an input stage connected thereto, formed as an emitter-follower. Each of the two pnp lateral transistors have a third partial collector, connected to its respective base.

All the examples shown are intended for construction by monolithic integrated planar technology. Of course, the circuits can also be constructed in different form, and by different technology, in which a thermal coupling of the appropriate elements is present; hybrid technology, for example, may be used.

Figure 1:
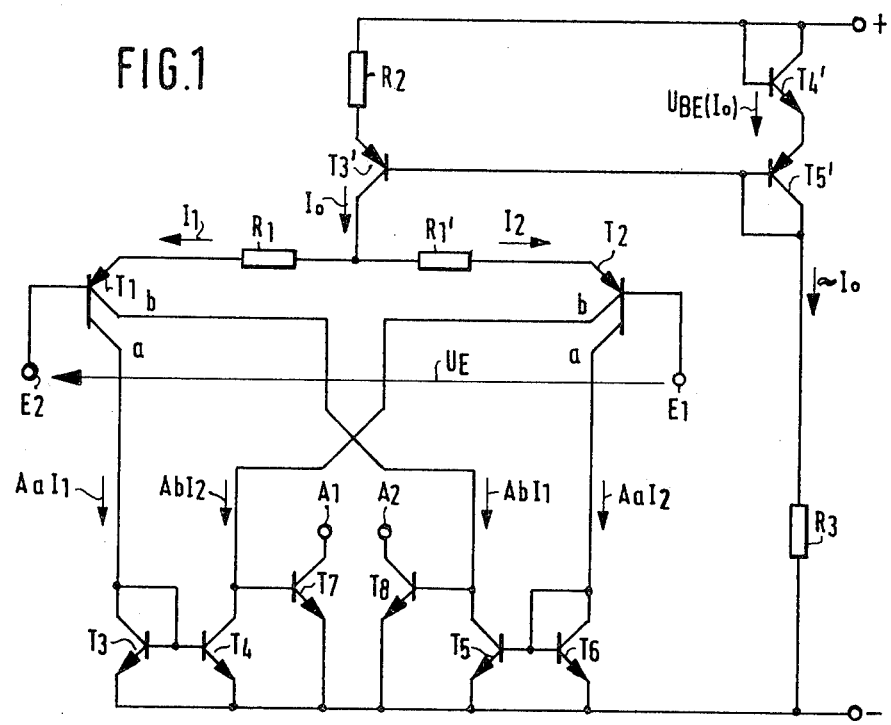
FIG. 1 is a schematic circuit diagram showing the basic circuit of a symmetrical threshold switch, having two output transistors and employing the bandgap principle.

The basic circuit—see FIG. 1—includes a difference amplifier formed of two lateral pnp transistors T1, T2. The emitters of the transistors T1, T2 are galvanically connected. The junction point of the emitters is connected over a current source to the positive current supply line or bus. The current source is formed by the switching elements T3' and R2; the reference source for current supply is formed by the circuit element T4', T5' and R3. The collectors of the two pnp lateral transistors T1, T2 are subdivided into two parallel collectors a, b respectively. The second partial collector, a, is respectively connected with the input of a pnp current mirror formed by transistors T3, T4 and T5, T6, respectively. The output of the current mirror is respectively connected with the first partial collector b of the other of the two lateral pnp transistors T1, T2 and with the base of an output transistor T7, T8, respectively. A resistor R1, R1' is connected in the emitter circuit of each of the two pnp lateral transistors T1, T2. These resistors, in the following mathematical analysis are assumed to be same and are both referred to as R1.

Referring to the circuit of FIG. 1: the output transistor T8—and neglecting the base current of the transistor T8 for this analysis—is energized when the following relationship is satisfied:

$$A \cdot b \cdot I_1 = A \cdot a \cdot I_2. \quad (1a)$$

wherein $A = B/B+1$ to define the collector-emitter current amplification of the pnp lateral transistors T1, T2 which, due to the tracking which occurs in integrated circuits, can be assumed to be equal. The input transistors T1, T2 have partial collectors in which the relationship of the effective edge dimensions or length is characterized by the relationship $a{:}b$, wherein $a+b=1$. From the relationship (1a) this follows:

$$\frac{I_1}{I_2} = \frac{a}{b}. \quad (1b)$$

Further, from Kirchoff's Law:

$$I_1 + I_2 = I_o. \quad (2)$$

Figure 3:
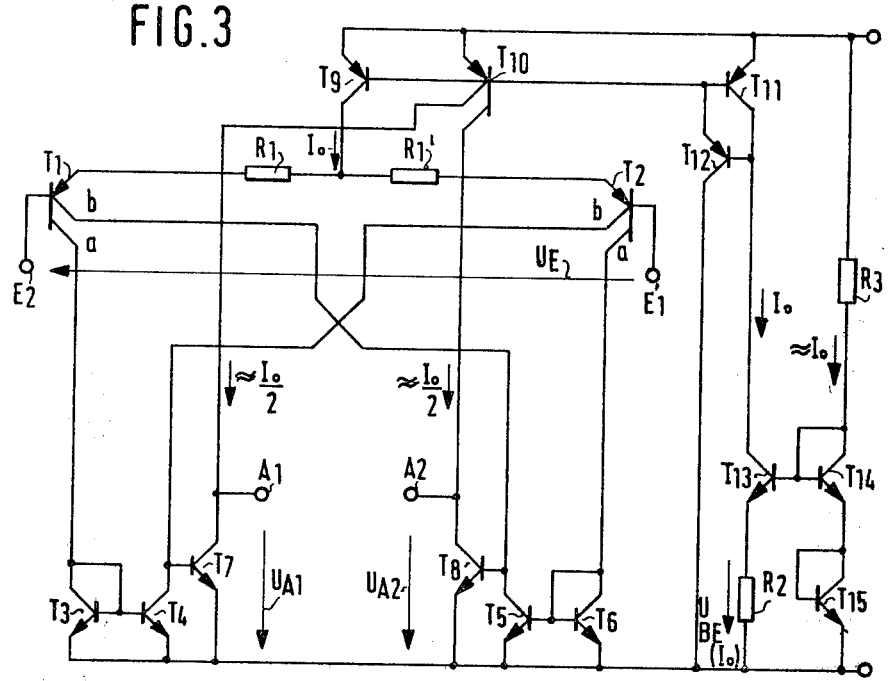
FIG. 3 is a circuit similar to FIG. 1 in which the current sources are differently connected and in which the output current sources for the separate outputs are provided.

The current $I_o$ is adjusted by the current supply, either as shown in FIG. 1 or as shown in FIG. 3 to the value:

$$I_o = \frac{U_{BE}(I_o)}{R_3}. \quad (3)$$

From the relationships (1b), (2), and (3) the difference of the currents $I_1$, $I_2$ will be:

$$I_1 - I_2 = \frac{a-b}{a+b} \cdot \frac{U_{BE}(I_o)}{R_3}. \quad (4)$$

The input voltage which is required to control the output transistors T8 then will be:

$$U_{E1} = (I_1 - I_2) \cdot R_1 + U_T \ln \frac{I_1}{I_2}, \quad (5)$$

wherein $U_T$ $(kT/q)$, which is the temperature voltage, and wherein k is the Boltzmann constant, T the absolute temperature and q is the election elementary charge or, within equation (4) and equation (1b):

$$U_{E1} = \frac{a-b}{a+b} \cdot \frac{R_1}{R_3} \cdot U_{BE}(I_o) + U_T \ln \frac{a}{b}. \quad (6a)$$

If it is intended to render $U_{E1}$ temperature independent, then the two proportions, that is, the voltages proportional to $U_{BE}$ and $U_T$ must be suitably divided in accordance with the bandgap principle. To make this clear, equation (6a) is expanded by the factor $$(a+b)\cdot R_3/(a-b)\cdot R_1 \quad (6')$$

and one obtains:

$$U_{E1} \cdot \frac{a+b}{a-b} \cdot \frac{R_3}{R_1} = U_{BE}(I_o) + \frac{a+b}{a-b} \cdot \frac{R_3}{R_1} \cdot U_T \ln \frac{a}{b}. \quad (6b)$$

This voltage becomes temperature independent when it is made equal to the voltage $U_{G0'}$, which is just slightly higher than the physical bandgap voltage $U_{G0}$ for silicon, and if one also considers the positive temperature coefficient of the integrated resistors R1, R2, R3. Thus, $$U'_{G0} = U_{E1} \cdot \frac{a+b}{a-b} \cdot \frac{R_3}{R_1} \quad (7a)$$

and $$U'_{G0} = U_{BE}(I_o) + \frac{a+b}{a-b} \cdot \frac{R_3}{R_1} \cdot U_T \cdot \ln \frac{a}{b}. \quad (7b)$$

Substitution of (7a) in the equation of (7b) results in:

$$U'_{GO} = U_{BE}(I_o) + \frac{U'_{GO}}{U_{E1}} \cdot U_T \cdot \ln \frac{a}{b}. \tag{7c}$$

The effective collector edge relationship of the two transistors T1, T2, for a predetermined response voltage $U_{E1}$ can be determined from equation 7c, as follows:

$$\frac{a}{b} = e^{\frac{U_{E1}}{U_T} \cdot \frac{U'_{GO} - U_{BE}(I_o)}{U'_{GO}}} \tag{8}$$

As an example:

$U'_{GO} = 1216$ mV, $I_o = 100$ μA, $U_{BE}(I_o) = 680$ mV, $U_T = 26$ mV, $U_{E1} = 35$ mV the foregoing results in a ratio a/b=1.81, which, if $a + b = 1$ $a = 0.64$ and $b = 0.36$ as the proportion of the edge dimensions of the collectors a and b.

The relationship a/b, determined by the equation 8 can further be used to determine the relationship of the resistance values of resistors R1/R3:

$$\frac{R_1}{R_3} = \frac{\frac{a}{b} + 1}{\frac{a}{b} - 1} \cdot \frac{U_{E1}}{U'_{GO}}. \tag{9}$$

In the example above: R1/R3=0.1. If R3=$U_{BE\,(Io)}$/$I_o$=680 mV/100 μA=6.8 kΩ then R1=680Ω.

Figure 2:
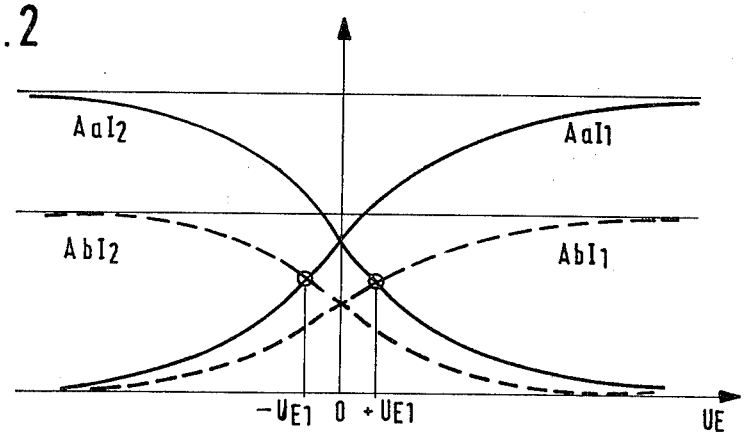
FIG. 2 is a graph illustrating the relationship of currents and input voltage on which the operation of the circuit of FIG. 1 is based.

FIG. 2 illustrates the currents of the circuit of FIG. 1 with respect to an input difference voltage $U_E$ to illustrate the operation of the circuit, in schematic form.

In the range $U_E \geq U_{E1}$ in which the current $AbI_1$ exceeds the current $AaI_2$, output transistor T8 becomes conductive. In the range in which $U_E \leq U_{E1}$, $AaI_2 > AbI_1$ causes transistor T5 to saturate and, consequently, T8 will block.

It can also be seen that, due to the symmetry of the arrangement, the switchover point for the other output transistor T7 is at $U_E = -U_{E1}$.

FIG. 1 shows the output formed only by the output transistors T7, T8 themselves; thus, the output is an open collector output. For completion of the output circuit, and to provide pull-up currents, an additional output circuit can be connected as shown in FIG. 3, in which the pull-up currents are derived from a dual collector-transistor T10.

In FIG. 3, the currents are made suitably approximately equal to half of $I_o$, so that they will correspond to approximately the sum of the collector currents of the current mirror transistors T3, T4, and T5, T6, respectively, at the response point. Due to tracking of the current amplification of the transistors T3, T4, T7 and T5, T6, T8 respectively, the base currents are approximately equalized, so that the input response voltage $U_{E1}$ and $-U_{E1}$ are effectively independent of current amplification and the temperature change thereof.

In addition to this change, FIG. 3 also illustrates another form of the common current supply source, which is particularly suitable when the transistor T10 is used in the output.

The current supply source, according to FIG. 3, is formed by the circuit elements R2, R3; and T11, T12, T13, T14, and T15.

As can be seen from a mere inspection of FIGS. 1 and 3, the current supply sources, in basic philosophy, are similar with the arrangement of FIG. 3 providing improved compensation and stability at higher output.

Figure 4:
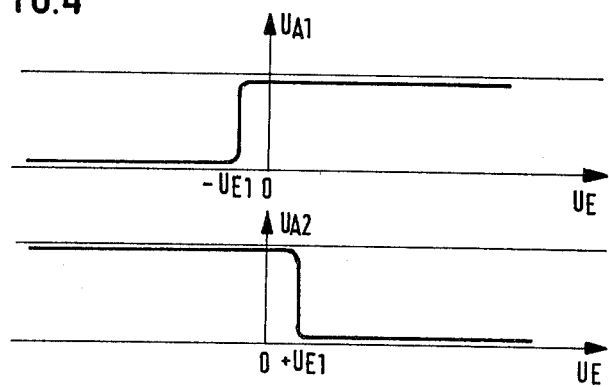
FIG. 4 is a graph illustrating the relationship of output voltage and input voltage of the circuit of FIG. 3.

FIG. 4 illustrates, schematically, the dependence of the output voltage U11, and U12 on input difference voltage $U_E$ for the circuit of FIG. 3. At high current amplification of the output transistors T7, T8, they practically completely switch over at the respective response points $+U_{E1}$ and $-U_{E1}$.

Figure 5:
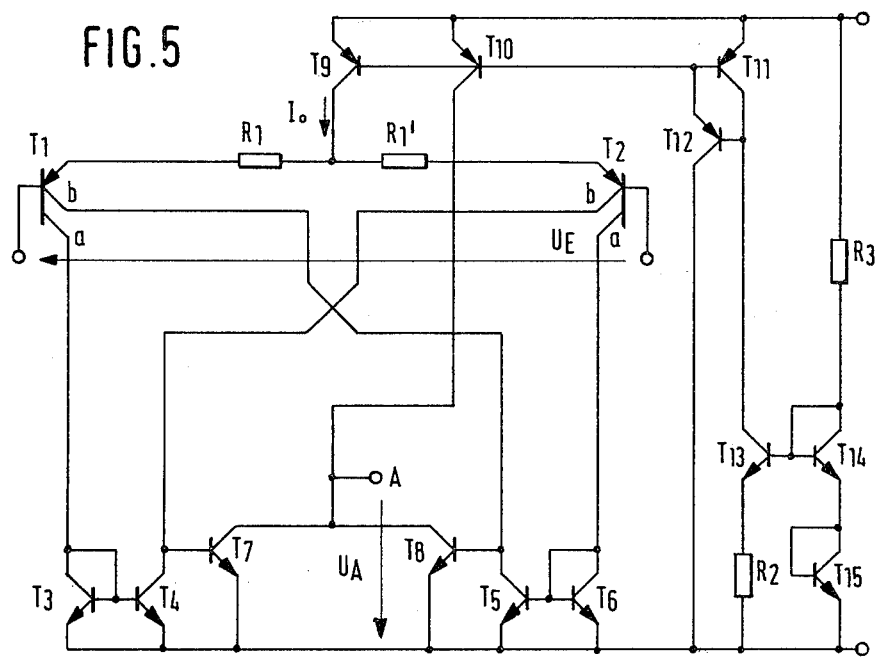
FIG. 5 is a circuit diagram similar to that of FIG. 3 in which the outputs are combined by a logic gate illustrated as a NOR-gate, so that the circuit becomes a window-comparator.
Figure 6:
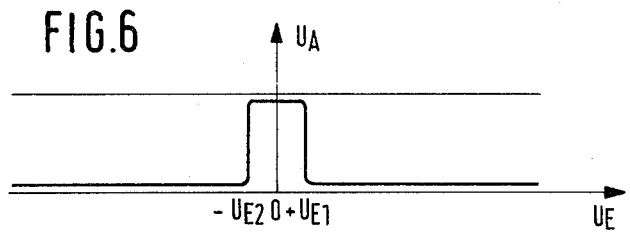
FIG. 6 is an illustration of a dependence of the output voltage on input voltage in the circuit of FIG. 5.

FIG. 5 illustrates an arrangement in which the two outputs of the transistors T7, T8 are combined; the collectors of the output transistors T7, T8 are connected to a common output A of a NOR-circuit which operates this way: when the transistor T7, or the transistor T8 is conductive, the output A is "low". As seen on FIG. 6, the circuit of FIG. 5 thus becomes a window-comparator with a temperature compensated response window having the width $2U_{E1}$, symmetrical with respect to $U_E=0$.

Figure 7:
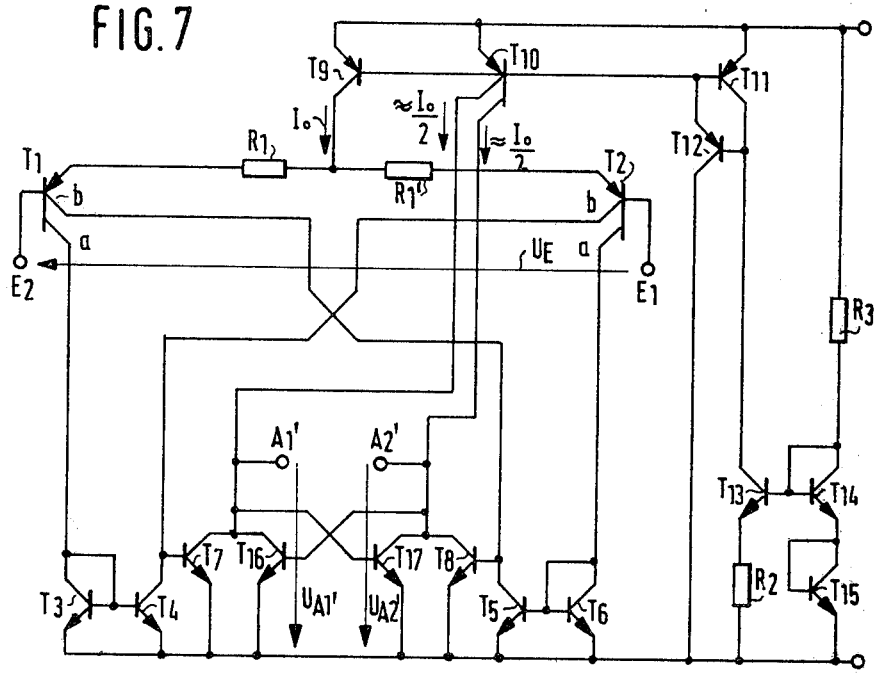
FIG. 7 is a circuit similar to that of FIG. 3 in which the output transistors are interconnected by further transistors to form a flipflop circuit providing a symmetrical threshold switch with hysteresis.

FIG. 7 illustrates a circuit in which, in contrast to FIG. 3, the output transistors T7, T8 have additional transistors T16, T17 connected thereto, to form two cross-connected NOR-circuits in a feedback circuit, to form a simple RS flipflop (FF).

Figure 8:
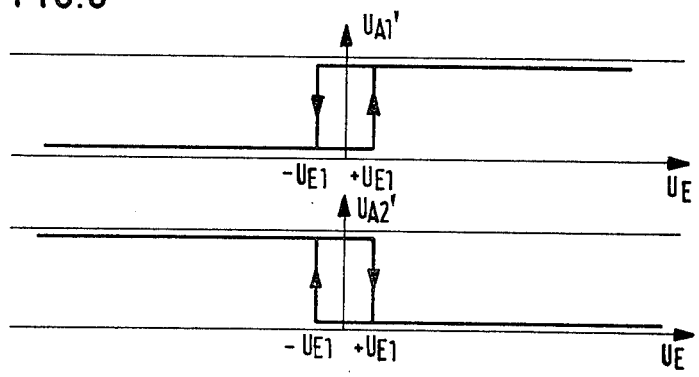
FIG. 8 illustrates the relationship of output voltage of the flipflop in dependence on the input voltage of the circuit of FIG. 7.

The operation of the circuit of FIG. 7 is illustrated, graphically, in FIG. 8. The flipflop outputs A1', A2' switch over at the transfer points $U_{E1}$ and $-U_{E1}$, with hysteresis. The circuit of FIG. 7 thus provides the opportunity to convert sine-wave input voltages, or input voltages which are at least roughly similar to sine-waves into square-wave output voltages. Both outputs A1', A2', selectively, can be utilized as outputs for such square-wave conversion, preferably with appropriate signal amplification.

The circuit of FIG. 7 is not entirely suitable for the special application in which the reference potential is applied to one of the inputs E1, or E2, that is, if either one of the inputs is to be placed on ground or mass or chassis potential. This may be the case, however, if an inductive transducer has one terminal connected to ground or chassis; this is due to the operation of the input transistors T1, T2 which is practically within the saturation region.

It is easily possible, however, to avoid this difficulty.

Figure 9:
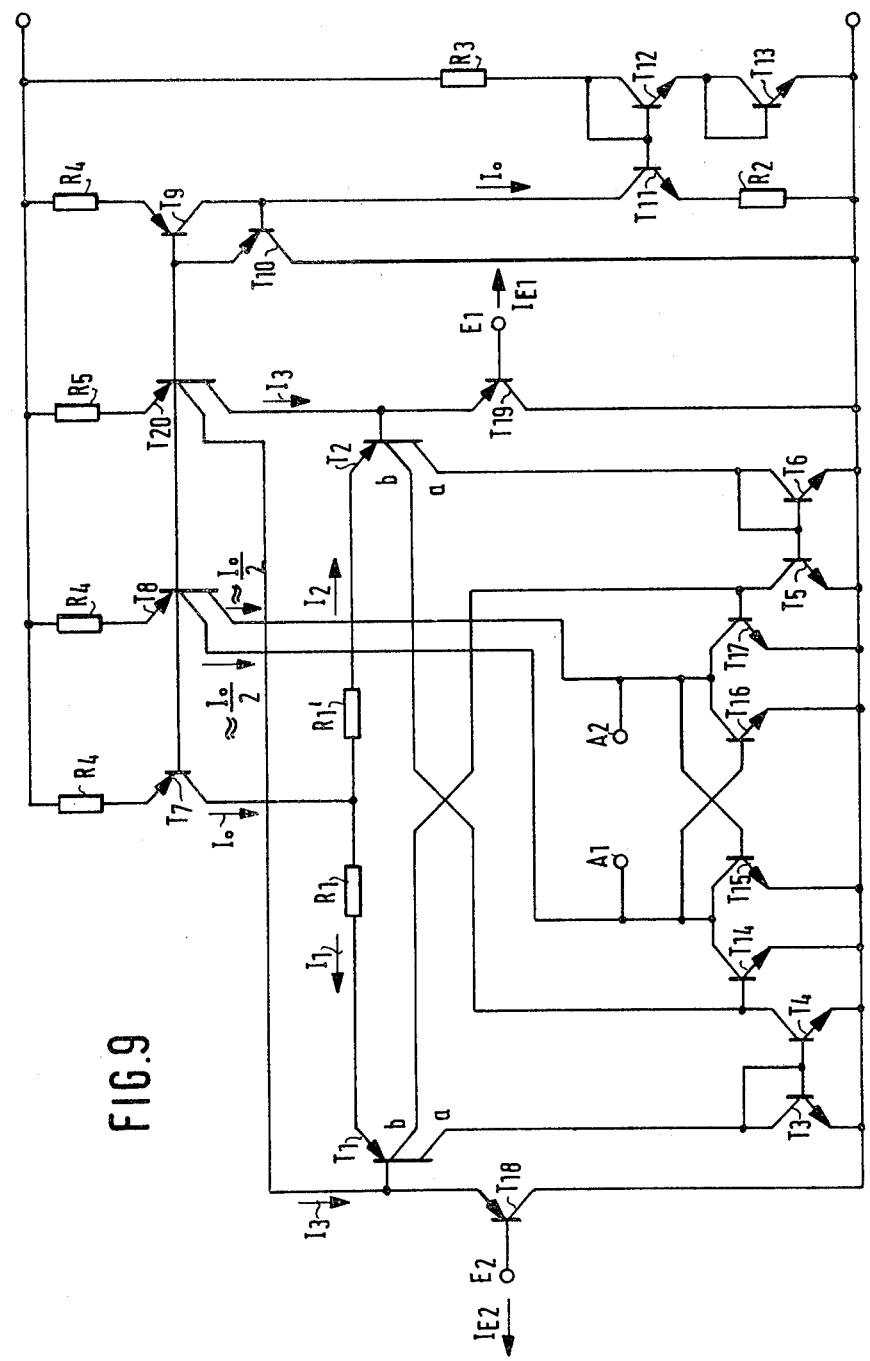
FIG. 9 is a circuit diagram similar to that of FIG. 7 in which substrate transistors in emitter-follower circuit with auxiliary current sources are connected to the inputs, in order to permit connection of a reference potential to one of the new inputs, that is, to connect one of the inputs to ground or chassis in the example shown, and to decrease the input currents.

FIG. 9 illustrates a circuit arrangement in which a separate set of input transistors T18, T19 is provided in order to permit wide applicability of the system, and to permit it to operate also with an inductive transducer which has one terminal thereof connected to ground or chassis. The input transistors T18, T19 are preferably formed as pnp substrate transistors in integrated bipolar-planar technology. It is possible to avoid differential base currents of the transistors T1, T2 causing in the base-emitter circuit of the transistors T18, T19 a corresponding additional offset voltage, and asymmetry of the switching points, by applying additional currents I3 by means of a further current source transistor T20, with dual collectors. The additional currents I3 should be comparatively large with respect to the base currents of the transistors T1, T2. Due to the high current amplification of the substrate transistors T18, T19, smaller input currents $I_{E1}$ and $I_{E2}$ can be used than in the simpler circuit of FIG. 7. This is desirable due to inaccuracies and tolerances which occur in the inherent inner resistors of the transducer to which the circuit is connected, and improves the symmetry of the switching points, in spite of changes in internal transducer resistances. The resistor R5, additionally shown in FIG. 9, and connected with the emitter of transistor T20 is provided to set the value of the additional I3. Stabilizing resistors R4 are also shown in FIG. 9 which improve the accuracy of the current levels of the currents to be supplied.

Figure 10:
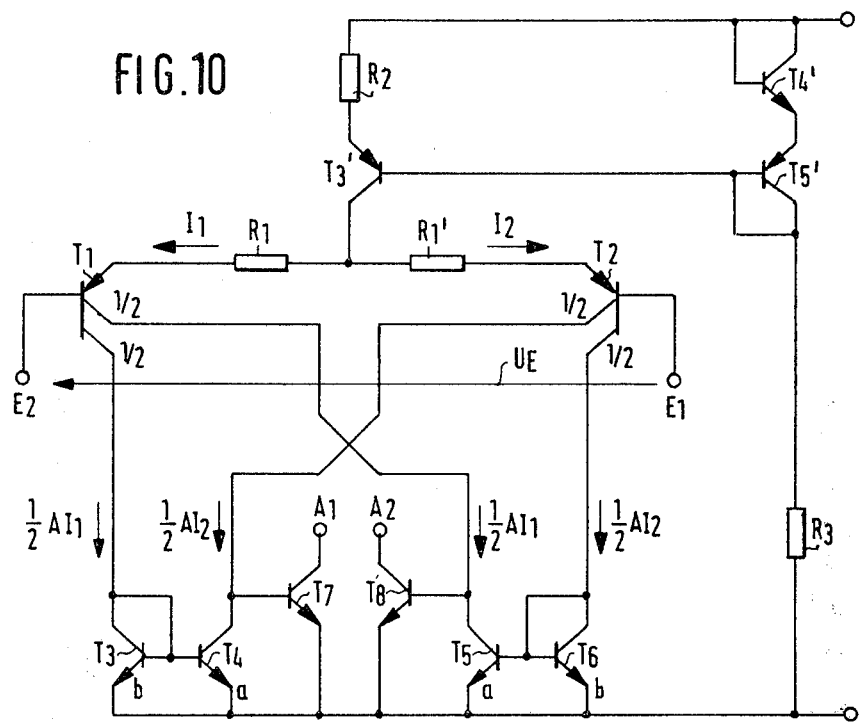
FIG. 10 shows a circuit in which the different collector dimensions of the input lateral transistors are replaced by different emitter surfaces in the current-mirror transistors.

FIG. 10 illustrates a further embodiment, which is a variation on the base circuit of FIG. 1 but, of course, may be used with the other circuits as well. The difference with respect to FIG. 1, is this: the input transistors T1, T2 have equal partial collectors, that is, the collectors are divided equally, half and half. Instead of the collectors dimensions being differential arranged, the emitter surfaces of the pnp current-mirror transistors T3, T4 and T5, T6, respectively, have the ratios a:b. This permits application of the same inventive concept, namely that the outputs of the circuits will switch upon occurrence of a predetermined relationship I1:I2. Equation 1a will then be modified and read, instead:

$$\tfrac{1}{2} \cdot A \cdot I_1 = \tfrac{1}{2} \cdot A \cdot \tfrac{a}{b} \cdot I_2, \tag{1a'}$$

which, again, leads to the current relationships:

$$\frac{I_1}{I_2} = \frac{a}{b} \tag{1b}$$

all further relationships, which were derived from the circuit of FIG. 1, will be the same also for the embodiment of FIG. 10.

The two arrangements, illustrated in FIG. 1 and FIG. 10, respectively, can be combined in order to obtain the desired switching relationship I1: I2 at the switching point. This may be desirable under certain constructional conditions, for example to facilitate the topological layout on an integrated circuit chip.

FIG. 11 shows a further variation of the circuit arrangement in accordance with FIG. 9. The two pnp lateral transistors T1, T2, forming the difference amplifiers each have a further third partial collector c applied thereto, which is connected to the base of the respective transistors T1, T2. This form of transistor permits elimination of the current source formed by transistors T20 and R5, both illustrated in FIG. 9.

The principle of the invention permits also setting of different switching points at the respective positive and negative half-waves, so that the switching at one half wave occurs at a level which is different from that of the other half wave, mathematically $$|U_{E2}| \neq U_{E1}.$$

To do so, the lateral dimensions of the collectors of the transistors T1, T2 and/or the emitter surfaces of the transistors T3, T4 and T5, T6 respectively, are asymmetrically divided. For example, the transistor T1 and/or transistor T2 may be formed with a further partial collector to draw off any excess current portion to ground or chassis. Further, the resistors R1, R1' which, in the previous derivation were considered to be the same, could be made of different value. It is then also possible to make either one of the switchover points $U_{E1}$ or $U_{E2}$ to occur at zero or null voltage.

The circuits which are described can be carried out in various forms; of course, complementary technology, in which pnp and npn transistors are interchanged may be used. It is to be noted, however, that rather than subdividing the collectors of pnp lateral transistors in parallel, the emitters of npn transistors must be arranged to have the respective surface relationships, in dependence on the selection of the embodiment of FIG. 1 or 10, or combination thereof. The exact construction of course, of such complementary design is an engineering matter and well-known in the art. The specification and claims, thus, whenever reference is made to one type of transistor, are deemed to include the complementary type, and modified in accordance with the foregoing consideration, as well known in the transistor application circuitry design field.

The circuit is highly versatile, particularly highly temperature stable and provides for accurate switchover, seen symmetrically with respect to a reference potential, preferably zero or ground, but not necessarily so; hysteresis can be provided. The output signals can be interconnected, or separately evaluated. Interconnection may be with or without hysteresis, and made through the window comparator; by the use of a flip-flop output circuit, even only slowly varying signals in the nature of undulating, only approximately sine-wave signals, can be evaluated, for example as derived from a wheel-speed transducer at a time when the wheel rotates only very slowly, so that the output is a flat undulating wave or low amplitude. Further, the circuit can readily be modified to provide for asymmetrical response, that is, response to input which is asymmetrical with respect to a reference, or, for example, null or at the crossover line on a graph of input voltage vs. time.

Various changes and modifications may be made and features described in connection with any one of the embodiment may be used with any of the others, within the scope of the inventive concept.

I claim:

1. Threshold switching circuit to provide an output signal (A1–A2) when an input signal (E1–E2) exceeds a predetermined threshold level comprising
   a difference amplifier including two lateral pnp transistors (T1, T2) connected in a differential circuit,
   the emitters of said lateral transistors being galvanically interconnected,
   the two pnp lateral transistors (T1, T2) having, each, two partial collectors (a, b);
   a current source ($I_o$), connected to the emitters of the two lateral transistors;
   an output circuit including two current mirror circuits (T3, T4; T5, T6);
   each having their respective inputs connected to one (a) of the partial collectors of a respective lateral transistor and its output cross-connected with the other (b) partial collector of the other one of the pnp lateral transistors;
   an output coupling circuit additionally connected to the outputs of the current mirror circuits;
   wherein the two partial collectors (a, b) of said lateral transistors (T1, T2) are of unequal dimension to provide for unequal conduction characteristics of the respective transistors for rendering the output of said transistors asymmetrical with respect to each other, the non-equality defining the response threshold level, the unequal conduction characteristics of said transistors resulting in unequal conduction of said transistors in dependence on the level of the input signal with respect to the threshold level, and hence generation of an output signal representative of the level of the input signal with respect to said threshold level.

2. Switching circuit according to claim 1 wherein the output coupling circuit includes two output transistors (T7, T8), each having a respective base connected to the output of the respective current mirror circuit.

3. Switching circuit according to claim 1 including a current supply source (T3', T4', T5') for the transistors, said current supply source including a diode element (T4', T5') to render the supply current delivered thereby dependent on the diode current flow for temperature compensation;

and wherein the lateral transistors (T1, T2) each have a resistor (R1, R1') connected to the emitter connection thereof, the current supply source being connected to the junction of said resistors (R1, R1') to provide for temperature compensation of response of the threshold and temperature in dependence of response with respect to threshold voltages ($U_{E1}$, $U_{E2}$) of the input signal.

4. Switching circuit in accordance with claim 2 further including (FIG. 5) a logic circuit (T7, T8, T10) interconnecting said output transistors (T7, T8).

5. Switching circuit according to claim 4 wherein (FIG. 7) said logic circuit comprises a flipflop (T16, T17).

6. Switching circuit according to claim 1 further including (FIG. 9) an emitter-follower input stage (T18, T19) connected to receive the input signal (E1, E2) and having its output connected to control the lateral transistors (T1, T2).

7. Switching circuit according to claim 6 further including a separate current supply source (T20-I3) connected to supply said emitter-follower transistors (T18, T19) and, additionally, the basis of said lateral transistors (T1, T2).

8. Switching circuit according to claim 6 wherein (FIG. 11) said transistors (T1, T2) are multiple collector transistors having a partial collector (c) connected to the base of the transistor, and its partial collector-base junction connected to the emitter of the respective emitter-follower input transistor (T18, T19) to form a current source therefor.

9. Switching circuit according to claims 1, or 2, or 3, or 5, or 6, or 7, or 8 wherein the current mirror circuits connected to said lateral transistors (T1, T2) include, each, a transistor pair (T3, T4; T5, T6);

and wherein the emitters of the transistors forming a pair (T3, T4; T5, T6) are of different dimensions to provide for defined unequal conduction of lateral transistors and form one or two defined threshold levels causing mismatch, or inequality in the conduction of the lateral transistors (T1, T2) forming the difference amplifier.

10. Threshold switching circuit to provide an output signal (A1-A2) when an input signal (E1-E2) exceeds a predetermined threshold level comprising a difference amplifier including two lateral pnp transistors (T1, T2) connected in a differential circuit, the emitters of said lateral transistors being galvanically interconnected, the two pnp lateral transistors (T1, T2) having, each, two partial collectors (a, b);

a current source ($I_o$), connected to the emitters of the two lateral transistors;

an output circuit including two current mirror circuits (T3, T4; T5, T6), each having their respective inputs connected to one (a) of the partial collectors of a respective lateral transistor and its output cross-connected with the other (b) partial collector of the other one of the pnp lateral transistors;

an output coupling circuit additionally connected to the outputs of the current mirror circuits;

wherein the current mirror circuits connected to said lateral transistors (T1, T2) include, each, a transistor pair (T3, T4; T5, T6);

and wherein the emitters of the transistors forming a pair (T3, T4; T5, T6) are of different dimensions to provide for defined unequal conduction of the lateral transistors and form one or two defined threshold levels causing mismatch, or inequality in the conduction of the lateral transistors (T1, T2) forming the difference amplifier.

11. Switching circuit according to claim 10 wherein the emitters of the transistors of a pair (T3, T4; T5, T6) have different surface areas.

12. Switching circuit according to claim 10 wherein the output coupling circuit includes two output transistors (T7, T8), each having a respective base connected to the output of the respective current mirror circuit.

13. Switching circuit according to claim 10 including a current supply source (T3', T4', T5') for the transistors, said current supply source including a diode element (T4', T5') to render the supply current delivered thereby dependent on the diode current flow for temperature compensation;

and wherein the lateral transistors (T1, T2) each have a resistor (R1, R1') connected to the emitter connection thereof, the current supply source being connected to the junction of said resistors (R1, R1') to provide for temperature compensation of response of the threshold and temperature in dependence of response with respect to threshold voltages ($U_{E1}$, $U_{E2}$) of the input signal.

14. Switching circuit in accordance with claim 12 further including (FIG. 5) a logic circuit (T7, T8, T10) interconnecting said output transistors (T7, T8).

15. Switching circuit according to claim 14 wherein (FIG. 7) said logic circuit comprises a flipflop (T16, T17).

16. Switching circuit according to claim 10 further including (FIG. 9) an emitter-follower input stage (T18, T19) connected to receive the input signal (E1, E2) and having its output connected to control the lateral transistors (T1, T2).

17. Switching circuit according to claim 16 further including a separate current supply source (T20-I3) connected to supply said emitter-follower transistors (T18, T19) and, additionally, the basis of said lateral transistors (T1, T2).

18. Switching circuit according to claim 16 wherein (FIG. 11) said transistors (T1, T2) are multiple collector transistors having a partial collector (c) connected to the base of the transistor, and its partial collector-base junction connected to the emitter of the respective emitter-follower input transistor (T18, T19) to form a current source therefor.

* * * * *